United States Patent
Zach

(10) Patent No.: US 8,058,627 B2
(45) Date of Patent: Nov. 15, 2011

(54) ADDRESSABLE TRANSMISSION ELECTRON MICROSCOPE GRID

(75) Inventor: Michael Zach, Stevens Point, WI (US)

(73) Assignee: Wisys Technology Foundation, Madison, WI (US)

( * ) Notice: Subject to any disclaimer, the term of this patent is extended or adjusted under 35 U.S.C. 154(b) by 188 days.

(21) Appl. No.: 12/541,001

(22) Filed: Aug. 13, 2009

(65) Prior Publication Data

US 2010/0038557 A1 Feb. 18, 2010

Related U.S. Application Data

(60) Provisional application No. 61/088,415, filed on Aug. 13, 2008.

(51) Int. Cl.
*G21K 5/08* (2006.01)
*H01B 13/00* (2006.01)

(52) U.S. Cl. ...................... 250/440.11; 216/13

(58) Field of Classification Search .......... 250/307–311, 250/440.11–443.1; 204/285, 286.1; 216/13–21
See application file for complete search history.

(56) References Cited

U.S. PATENT DOCUMENTS

| | | | |
|---|---|---|---|
| 4,139,401 A * | 2/1979 | McWilliams et al. | 438/404 |
| 5,091,651 A * | 2/1992 | Hokke | 250/440.11 |
| 5,367,171 A * | 11/1994 | Aoyama et al. | 250/443.1 |
| 5,572,026 A * | 11/1996 | Ikeda | 250/307 |
| 5,767,516 A * | 6/1998 | Kawanami et al. | 250/311 |
| 5,821,544 A * | 10/1998 | Augustus et al. | 250/440.11 |
| 5,898,177 A * | 4/1999 | Hidaka et al. | 250/311 |
| 5,990,478 A * | 11/1999 | Liu | 250/307 |
| 6,140,652 A * | 10/2000 | Shlepr et al. | 250/440.11 |
| 6,495,838 B1 * | 12/2002 | Yaguchi et al. | 250/443.1 |
| 6,793,849 B1 * | 9/2004 | Gruen et al. | 252/502 |
| 7,335,882 B1 * | 2/2008 | Brown et al. | 250/311 |
| 7,622,371 B2 * | 11/2009 | Pan et al. | 438/500 |
| 7,687,876 B2 * | 3/2010 | Kabir | 257/471 |
| 7,704,114 B2 * | 4/2010 | Tseng et al. | 445/23 |
| 2003/0089860 A1* | 5/2003 | Asjes | 250/442.11 |
| 2005/0110024 A1* | 5/2005 | Swain et al. | 257/77 |
| 2006/0192475 A1* | 8/2006 | Lee et al. | 313/495 |
| 2008/0036038 A1* | 2/2008 | Hersee et al. | 257/615 |
| 2008/0237464 A1* | 10/2008 | Zhang et al. | 250/311 |
| 2008/0280099 A1* | 11/2008 | Hutchison et al. | 428/138 |
| 2008/0290290 A1* | 11/2008 | Nagakubo et al. | 250/443.1 |
| 2009/0173882 A1* | 7/2009 | Kuwabata et al. | 250/307 |
| 2009/0194418 A1* | 8/2009 | Kawakami | 204/434 |
| 2009/0242016 A1* | 10/2009 | Zach | 136/252 |
| 2010/0026165 A1* | 2/2010 | Lee et al. | 313/496 |
| 2010/0140497 A1* | 6/2010 | Damiano et al. | 250/440.11 |
| 2010/0143198 A1* | 6/2010 | Damiano et al. | 422/104 |
| 2010/0181482 A1* | 7/2010 | Zhang et al. | 250/311 |
| 2010/0319759 A1* | 12/2010 | Fisher et al. | 136/252 |
| 2011/0079710 A1* | 4/2011 | Damiano et al. | 250/307 |
| 2011/0186942 A1* | 8/2011 | West et al. | 257/414 |

* cited by examiner

*Primary Examiner* — Jack Berman
*Assistant Examiner* — Wyatt Stoffa
(74) *Attorney, Agent, or Firm* — Boyle Fredrickson, S.C.

(57) ABSTRACT

A planar substrate for electrochemical experimentation provides multiple isolated electrical conductors sandwiched between insulating layers of ultrananocrystalline diamond. The isolated electrical conductors may attach to conductive pads at the periphery of the substrate and exposed at apertures in the central region of the substrate for a variety of experimental purposes.

11 Claims, 1 Drawing Sheet

ADDRESSABLE TRANSMISSION ELECTRON MICROSCOPE GRID

CROSS REFERENCE TO RELATED APPLICATION

This application claims the benefit of U.S. provisional application 61/088,415 filed Aug. 13, 2008 and hereby incorporated by reference.

STATEMENT REGARDING FEDERALLY SPONSORED RESEARCH OR DEVELOPMENT

BACKGROUND OF THE INVENTION

The present invention relates generally to grids for transmission electron microscopes.

Transmission electron microscopy (TEM) uses a beam of electrons that is transmitted through a thin specimen to produce an image revealing the interaction of the electrons with the material of the specimen. The specimen may be held on a transmission electron microscope grid typically being a thin, electron transparent disk having a diameter of approximately 3 mm and a thickness on the order of 20-300 µm.

SUMMARY OF THE INVENTION

The present invention provides a TEM grid that can be used as a substrate for research and development requiring electrical interaction with a specimen under continuous or periodic in-situ microscopic imaging. One embodiment provides an extremely thin and electron transmissive multilayer specimen support. The support includes multiple internal conductors that permit electrical signals to be brought in from the periphery of the grid to a central experimentation area where they are exposed in central apertures. Selective stimulation of the conductors permits electrical "addressing" of the apertures.

Specifically, the present invention may provide a transmission electron microscope grid comprising: a substantially planar substrate adapted to fit within a specimen holder of a transmission electron microscope. The substrate may in turn provide a lower insulating layer; a coplanar conductive layer patterned to provide multiple electrically isolated conductors leading from apertures of a central experimentation region to peripherally located contact pads and a non-conductive uppermost layer with the conductive pads passing through the upper most non-conductive layer to contact the electrically isolated conductors. The layered structure has a plurality of centrally located apertures with each aperture being contained within one of the electrically conductive isolated layers. These central apertures pass through all three layers to selectively expose the multiple electrically isolated conductors at the central experimentation region.

It is thus a feature of at least one embodiment of the invention to provide a TEM grid presenting TEM imagable and electrically addressable central regions for electrochemical experimentation.

The conductive pads may be a metal.

It is thus a feature of at least one embodiment of the invention to provide a TEM grid allowing easy electrical connection using relatively large pads displaced from the experimentation region and connectable with conventional techniques such as soldering and welding.

The grid may further include a second insulating layer attached to a rear surface of the coplanar conductive layer.

It is thus a feature of at least one embodiment of the invention to provide a convenient, freestanding substrate that is physically robust and electrically isolated on its broad surfaces.

The first insulating layer and coplanar conductive layer may be fabricated of a common material with different doping.

It is thus a feature of at least one embodiment of the invention to provide an extremely thin yet dimensionally stable multilayer device by using the same basis material for each of the layers.

The first insulating layer and coplanar conductive layer may be ultrananocrystaline diamond.

It is thus an object of the invention to provide a chemically inert, low adhesive material suitable for a wide range of electrical experimentations.

The central apertures may pass through both the first insulating layer and coplanar conductive layer to expose one or more multiple electrically isolated conductors at sidewalls of at least one aperture.

It is thus a feature of at least one embodiment of the invention to permit electrochemical experiments taking advantage of multiple dimensions presented by the apertures and the surface of the substrate.

The thickness of the planar substrate along the path of the electrons maybe substantially less than 1000 nm.

It is thus a feature of at least one embodiment of the invention to provide a substrate that provides low interference in oblique imaging.

These particular features and advantages may apply to only some embodiments falling within the claims and thus do not define the scope of the invention.

DETAILED DESCRIPTION OF THE PREFERRED EMBODIMENT

Figure 1:
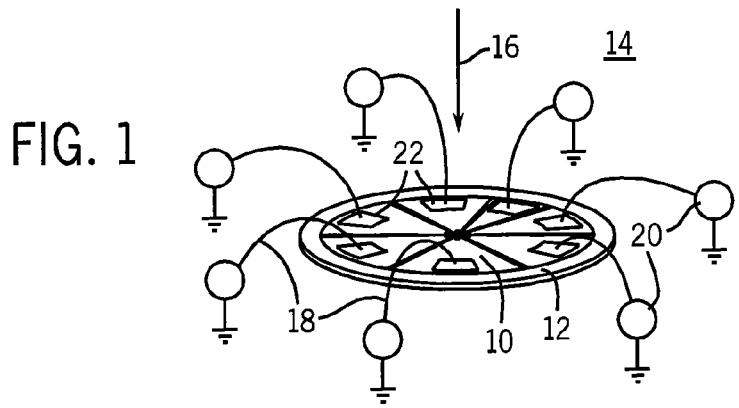
FIG. 1 is a perspective view of a TEM grid for the present invention as held in a TEM stage and connected with standard electrical conductors.

Referring now to FIG. 1, a TEM grid 10 of the present invention may be held within a stage 12 of transmission electron microscope 14 in the path of electron beam 16. In one embodiment, the TEM grid 10 is a thin planar disk having a broad surface normal to an axis of the beam 16. Electrical conductors such as wires 18 may lead from controlled voltage sources 20 to peripheral conductive pads 22 on the TEM grid 10. The connections to the conductive pads 22 may be subsequently covered with insulation to allow the TEM grid 10 to be immersed in a liquid or the like.

Figure 2:
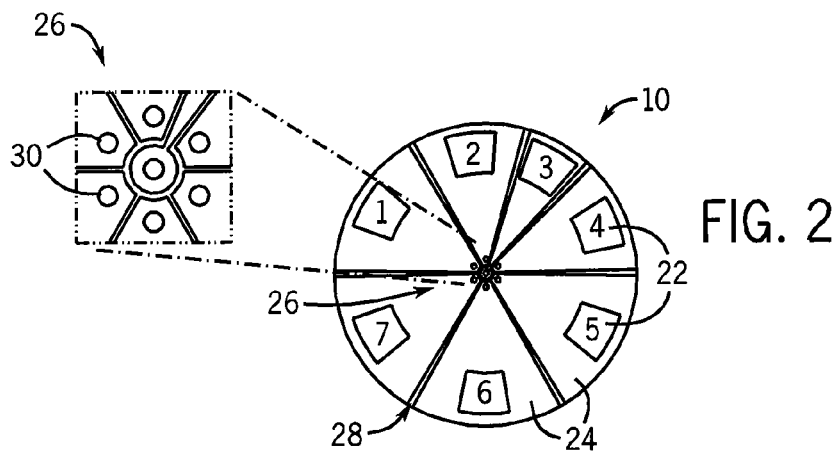
FIG. 2 is a top plan view of grid of FIG. 1 in phantom showing multiple conductive segments presented by the grid together with a detail showing the termination of the segments at central apertures.

Referring now also to FIG. 2, generally each of the peripheral conductive pads 22 (here also labeled 1-7) may be in electrical communication with one of multiple internal conductors 24 as will be described below. Each of these conductors 24 leads to a central experimentation area 26. As depicted, the conductors 24 may be approximately segments of a circle having their large arcuate edges attached to the pads 22 and their central vertices in the central experimentation area 26. Each conductor 24 is separated by an insulating gutter 28 between the conductors 24 and extending along lines of radius from the central experimentation area 26. A series of apertures 30 may be cut through the TEM grid 10 in the central experimentation area 26 along an axis generally parallel to the electron beam 16. In one embodiment, the apertures have a diameter of approximately 10 µm. Each of these apertures 30 may pass through a single one of the conductors 24 to expose edges of the conductor 24 as will be described or may pass through multiple of the conductors 24 (not shown). The conductors 24 nevertheless remained isolated from each other within the central experimentation area 26.

Figure 3:
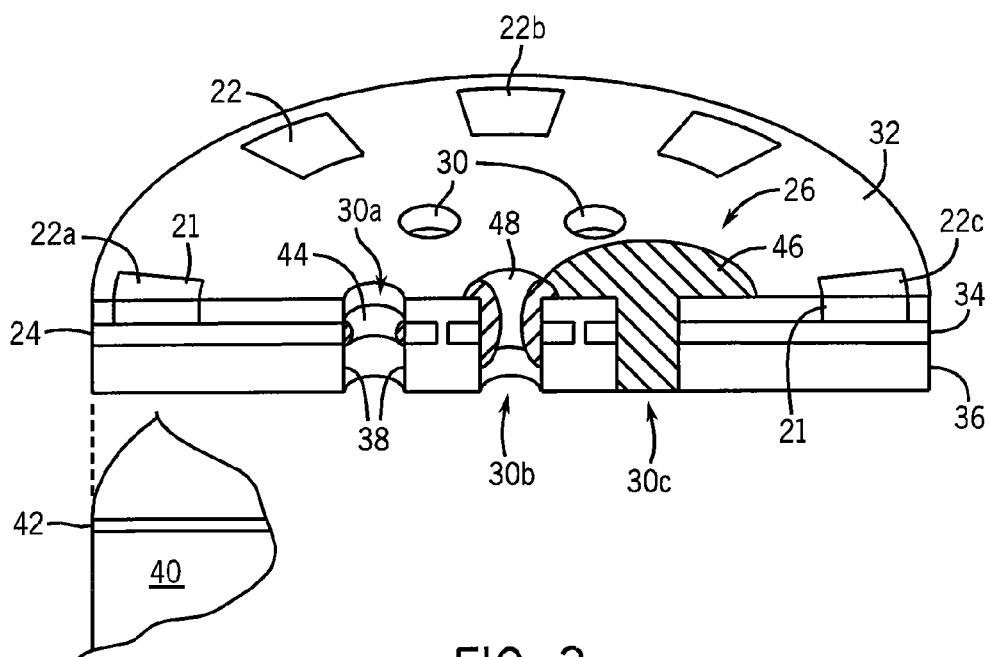
FIG. 3 is a perspective, exploded view of the grid of FIGS. 1 and 2 in cross-section showing use of the grid in a first experiment for electrochemical growth of materials in multiple dimensions.

Referring now to FIG. 3, an upper planar layer 32 of the TEM grid 10, may be fabricated of ultrananocrystaline diamond. The ultrananocrystaline diamond of layer 32 is undoped and thus an insulator. In one embodiment, this layer 32 may be 75 nm thick.

This layer 32 may be on top of and attached to a layer 34 forming the conductors 24. This layer 34 may be 50 nm thick and preferably is constructed of N-doped (nitrogen doped) ultrananocrystaline diamond so it is electrically conductive. A third layer 36 may be attached to the rear surface of the layer 34 and consists of ultrananocrystaline diamond preferably of approximately 500 nm thickness and undoped to be insulating.

Peripheral apertures 21 are cut only in the layer 32 to allow the introduction of the conductive pads 22 passing through layer 32 to contact the conductors 24. The apertures 30 may be cut through all three layers 32, 34, and 36 to expose the conductors 24 on the sidewalls 38 of the apertures 30.

The TEM grid 10 may be constructed by first depositing layer 36 on a silicon substrate 40 having a surface layer of tungsten 42. The layers 34 and 32 may be then successively overlaid on layer 36 using techniques understood in the art while providing the doping necessary for conductors 24. Reactive ion etching can be used to create peripheral apertures for the introduction of the pads 22 and the central apertures 30. The layers 32, 34, and 36 may then be removed from the substrate 40 by etching away of the tungsten 42. This can be done by aggressive treatments such as "piranha rinse" or may be possible through the use of selective copper etchants. Alternatively the silicon substrate 40 may be removed using a KOH etch or the tungsten 42 can be placed over a sacrificial copper layer (not shown) that is etched away. The tungsten 42 can then be removed from layer 36 as a separate step.

Referring still to FIG. 3, the TEM grid 10 may be used, for example, by placing an electrical voltage on one of the pads 22a to be conducted by conductor 24 to aperture 30a where it may be used for example to grow and electrochemically induced product 44 such as a nano dimension metal wire toroid deposited from an ionic solution or the like (not shown). In this case, the voltage at the pad 22 is referenced to the electrochemical equilibria established between the metal of the product 44 and a second surface such as in aperture 30b. Through the use of ionic liquids, this deposition process can be conducted in the vacuum of the TEM 14.

Different materials 46 and 48 may be grown in this fashion to mushroom to the upper surface of the layer 32 and connect together on that surface to permit for the study of such interfaces and junctions both through the use of the TEM 14 and by electrical measurements made through the conductors 24. For example, a material 48 may be grown in aperture 30b by contact with pad 22b and a material 46 may be grown in aperture 30c by contact with pad 22c. The time of growth, possibly observed by the TEM 14 can be accurately controlled to control the junction so formed.

The growing of nano wires in the aperture 30a can be used to study the mechanical properties of those wires (for example, tensile strength) and the adhesion to the material of the TEM grid 10 through the use of small force measuring transducers known in the art that may fit within the TEM 14. Such transducers are commercially available from Hysitron, Inc. of Minneapolis, Minn. USA.

The TEM grid 10 provides a low-cost substrate for making electric devices such as diodes, transistors, LEDs, solar cells, and batteries at the nano scale without the need for expensive equipment. The TEM grid 10 may also be used for biological studies with the conductors used for electrical measurements or stimulation of biological tissue grown on the TEM grid 10. The optical transparency of the ultrananocrystaline film makes the grid design suitable for optical observation while the small apertures 30 permit immobilization of individual cells.

The present invention has been described in terms of the preferred embodiment, and it is recognized that equivalents, alternatives, and modifications, aside from those expressly stated, are possible and within the scope of the appending claims.

I claim:

1. A transmission electron microscope grid comprising:
   a substantially planar substrate adapted to fit within a stage of a transmission electron microscope, the substrate providing:
   a first insulating layer providing a plurality of peripheral apertures through the first insulating layer at a periphery of the substrate;
   a coplanar conductive layer attached to a rear surface of the first insulating layer to be coplanar with the first insulating layer and patterned to provide multiple electrically isolated conductors leading from the peripheral apertures to a central experimentation region of the substrate within the periphery of the substrate;
   conductive pads exposed at a front surface of the first insulating layer and passing through the peripheral apertures to electrically contact the electrically isolated conductors; and
   central apertures in the central experimentation region passing through the first insulating layer to selectively expose the multiple electrically isolated conductors at the central experimentation region.

2. The transmission electron microscope grid of claim 1 the conductive pads are a metal.

3. The transmission electron microscope grid of claim 1 further including a second insulating layer attached to a rear surface of the coplanar conductive layer.

4. The transmission electron microscope grid of claim 1 wherein the first insulating layer and coplanar conductive layer are fabricated of a common material with different doping.

5. The transmission electron microscope grid of claim 2 wherein the first insulating layer and coplanar conductive layer are ultrananocrystalline diamond.

6. The transmission electron microscope grid of claim 1 wherein the central apertures pass through both the first insulating layer and coplanar conductive layer to expose one or more multiple electrically isolated conductors at sidewalls of at least one aperture.

7. The transmission electron microscope grid of claim 1 wherein a thickness of the planar substrate is substantially less than 1000 nm.

8. The transmission electron microscope grid of claim 1 wherein in the planar substrate is a disk having a diameter of substantially 3 mm.

9. The transmission electron microscope grid of claim 1 wherein in the central apertures are arranged in a ring about a one central aperture.

10. A method of manufacture of a transmission electron microscope grid of a type providing a substantially planar substrate adapted to fit within a stage of a transmission electron microscope, the substrate providing: a first insulating layer providing a plurality of peripheral apertures through the first insulating layer at a periphery of the substrate; a coplanar conductive layer attached to a rear surface of the first insulating layer to be coplanar with the first insulating layer and patterned to provide multiple electrically isolated conductors leading from the peripheral apertures to a central experimentation region of the substrate within the periphery of the substrate; conductive pads exposed at a front surface of the first insulating layer and passing through the peripheral apertures to electrically contact the electrically isolated conductors; and central apertures in the central experimentation region passing through the first insulating layer to selectively expose the multiple electrically isolated conductors at the central experimentation region, the method comprising the steps of:

(a) depositing a first insulating layer of undoped ultrananocrystalline diamond on a substrate;

(b) overlaying a second layer of ultrananocrystalline diamond on the first layer, the second layer doped to provide electrical conduction (c) capping the second layer with a third insulating layer of un-doped ultrananocrystalline diamond;

(d) etching holes in at least the third insulating layer to provide the peripheral and central apertures (e) applying conductive material within the peripheral apertures; and (f) etching away the substrate.

11. A transmission electron microscope grid comprising:

a substantially planar substrate of ultrananocrystalline carbon adapted to fit within a stage of a transmission electron microscope, the substrate providing:

a first insulating layer of ultrananocrystalline carbon forming a front surface of the substrate and providing a plurality of peripheral apertures through the first insulating layer;

a coplanar conductive layer of ultrananocrystalline carbon attached to a rear surface of the first insulating layer to be coplanar with the first insulating layer and patterned to provide multiple electrically isolated conductors leading from the peripheral apertures to a central experimentation region of the substrate within the periphery of the substrate;

conductive pads exposed at a front surface of the first insulating layer and passing through the peripheral apertures to electrically contact the electrically isolated conductors; and central apertures in the central experimentation region passing through the first insulating layer to selectively expose the multiple electrically isolated conductors at the central experimentation region.

* * * * *